United States Patent
Matsuzaki

Patent Number: 5,592,081
Date of Patent: Jan. 7, 1997

[54] MAGNETIC SENSOR

[75] Inventor: Kazuo Matsuzaki, Nagano, Japan

[73] Assignee: Fuji Electric Co., Ltd., Japan

[21] Appl. No.: 418,105

[22] Filed: Apr. 6, 1995

[30] Foreign Application Priority Data

Apr. 6, 1994 [JP] Japan .................................. 6-067510

[51] Int. Cl.⁶ .......................... H01L 27/22; H01L 43/06; G01R 33/06
[52] U.S. Cl. ........................ 324/251; 324/244; 338/32 H; 257/421
[58] Field of Search ..................... 324/244, 251, 324/252, 260; 338/32 H, 32 R; 257/421, 427, 678

[56] References Cited

U.S. PATENT DOCUMENTS 5,146,201  8/1992  Kimura .................. 338/32 H

Primary Examiner—Walter E. Snow
Attorney, Agent, or Firm—Rossi & Associates

[57] ABSTRACT

A compact Hall element having a high magnetic sensitivity, a wide measuring range and which is resistant to application conditions such as high temperatures or radiations, includes a rectangular recess formed in a surface layer of an insulator layer, a negative electrode for emitting electrons and a positive electrode for collecting the electrons provided on the surface of the insulator layer surrounding the recess, a gate electrode located on the bottom of the recess so that it faces the negative electrode, Hall electrodes that are provided on the surface of both sidewalls of the recess and which are parallel with the line connecting the centers of width of the negative and positive electrodes. All of these electrodes are disposed in a vacuum containment structure.

18 Claims, 4 Drawing Sheets

MAGNETIC SENSOR

FIELD OF THE INVENTION

The present invention relates to a very small and highly sensitive magnetic sensor utilizing the Hall effect.

BACKGROUND

A variety of magnetic sensors are used for detecting or measuring magnetic fields, such as superconducting quantum interference device (SQUID) fluxmeters capable of measuring extremely weak magnetic fields of $10^{-14}$ T (tesla) or semiconductor Hall element magnetic sensors that are able to measure ultra-strong magnetic fields of 10 T or more. Such magnetic sensors are widely used, not only for measuring the intensity of magnetic fields but also for detecting currents or, in combination with magnetic substances, for measuring other physical quantities such as position and acceleration or for switching as switching elements. FIG. 7 shows operable ranges and major application fields of various well-known magnetic sensors (according to Kiyoshi Takahashi et al., "Dictionary of Sensors", Asakura shoten, 1991).

As shown in FIG. 7, conventional measurement of magnetism has used various magnetic sensors having different operational principles and structures in a wide ranges of measurement, which has resulted in the need to properly use them depending on their measuring ranges. Further, the above described variety of sensors must be used under limitations in their application conditions. For example, the sensor of a SQUID fluxmeter must be cooled to a very low temperature and thus it cannot be readily used in many applications.

Semiconductor magnetic sensors are widely used among conventional magnetic sensors because they are capable of measuring magnetic fields in a relatively wide range. As to the operational principles of semiconductor magnetic sensors, the Hall effect is most commonly applied and utilized as Hall element magnetic sensors.

The Hall effect will now be briefly described. When a magnetic field (with a magnetic flux density B) is applied in a direction perpendicularly to the direction of a current (I) flowing through a conductor, a Hall electrical field is produced in a direction perpendicular to both of the directions of the current and applied magnetic field to generate a voltage across a conductor. This is referred to as a Hall voltage V which is expressed by:

$$V_H = K_H \cdot B \cdot I \qquad (1)$$

where d, w, and L respectively represent the thickness, width, and length of the conductor through which the current flows. That is, the magnetic flux density B can be identified by measuring the Hall voltage $V_H$ which is proportional to the magnetic flux density B. $K_H$ represents product sensitivity which is expressed by the following equation.

$$K_H = R_H \cdot f_H / d \qquad (2)$$

where $R_H$ represents a Hall coefficient, and $f_H$ represents a shape factor which is a value related to L/w and a Hall angle θ and therefore approaches 1 with an increase in θ, i.e., with increases in Hall mobility $\mu_H = R_H \cdot \sigma$ (σ: electrical conductivity) and the magnetic flux density. Therefore, from Equations (1) and (2) we obtain:

$$V_H = R_H \cdot f_H \cdot I / d. \qquad (3)$$

If we assume a driving under a constant voltage, Equation (3) gives:

$$V_H = (w/L) R_H \cdot f_H \cdot \sigma \cdot B \cdot V \qquad (4)$$

where V is the applied voltage.

Therefore, the Hall voltage $V_H$ can be effectively increased by increasing (w/L), $R_H$, and σ. However, since (w/L) is a parameter which depends on the shape of the device and no significant change occurs in $f_H$ when the Hall angle θ is large, $R_H$ and σ become the key factors.

(a) $R_H$ is given by the following equation where n represents an electron density; e represents the charge of electrons; and c represents speed of light.

$$R_H = -(nec)^{-1} \text{ (CGS system)} \qquad (5)$$

That is, $R_H$ is inversely proportional to the electron density n.

(b) σ is given by the following equation where τ represents the time between electrons collisions and m* represents the effective mass of electrons.

$$\sigma = ne^2 \tau / m^* \qquad (6)$$

That is, σ is proportional to n and τ. As is apparent from Equations (5) and (6), the electron density n affects $R_H$ and σ oppositely. Therefore, it is not an effective factor for increasing both $R_H$ and σ.

A magnetic sensor comprising a semiconductor Hall element is compact and capable of measuring a magnitude of magnetic field of in a relatively wide range as shown in FIG. 7. However, its sensitivity and resolution are not satisfactorily suited for measuring magnetic flux densities of $10^{-9}$ T or less. Further, a semiconductor can not be used at high temperatures which causes the semiconductor to rapidly increase its carrier density. In addition, such a device has a problem in that it is susceptible to radiations. Thus, the fields of application of such a device is actually limited due to limitations in application conditions.

It is an object of the present invention to solve the following two problems.

(1) To improve magnetic sensitivity and expand the measuring range, i.e. to improve sensitivity and to allow a single magnetic sensor to cover a wide measuring range.

(2) To expand application conditions—to give excellent environmental range—proof characteristics and especially to enable operations at high temperatures.

SUMMARY OF THE INVENTION

In order to solve the above-described problems, a magnetic sensor according to the present invention has a structure similar to that of the so-called field emission type micro-vacuum-tube. Specifically, it comprises a positive electrode which is provided on an upper surface of an insulator surrounding a rectangular recess formed in a surface layer of an insulated substrate so that its end projects over the recess from a first side of the rectangular recess, a negative electrode which is provided so that its end projects over the recess from a second side opposite to the first side of the rectangle, the end including at least one electron emitting tip having a small radius of curvature, two Hall electrodes provided on the insulator in such a way that they are each on one of the two sides of the recess on which neither the positive nor the negative electrodes is provided, and a gate electrode provided on the bottom of the recess so that it faces said negative electrode, positive electrode, Hall electrodes, and gate electrode are disposed in a vacuum.

The Hall electrodes may be provided so that they are extended from the upper surface of the insulator layer along the surface of the inner wall of the recess.

The insulated substrate may be obtained by forming an insulator layer on a semiconductor substrate or by utilizing a quartz plate.

A containment structure, such as a cap made of a non-magnetic material, is utilized to provide a vacuum chamber for the electrodes.

The end of the negative electrode includes at least one tip that is preferably in a form which allows an increase in electric field intensity such as comb teeth or a wedge.

In a magnetic sensor having the structure as described above, the Hall mobility can be improved to increase the Hall voltage compared with conventional magnetic sensors constituted by a semiconductor Hall element, and thus the magnetic sensitivity is improved. This is based on the expanded time between collisions τ which is an effective means to achieve an enlarged product of the Hall coefficient $R_H$ and the electrical conductivity σ that is required for improving magnetic sensitivity as apparent from Equation (4), (5) and (6), and in a magnetic sensor constituted by a Hall element wherein carriers flow in a vacuum, the time between collisions can be expanded by at least one order or more compared with conventional Hall element with carriers flowing in a solid.

Since electrons responding to an external magnetic field flow in a vacuum, the sensor suffers ignorable temperature drifts observed in common solid state devices. Further, being less susceptible to deterioration due to temperature compared with semiconductors, it can be used at a high temperatures.

In addition, since the magnetic sensor has a similar structure to that of the so-called field emission type micro-vacuum tube, it can be formed on an insulated substrate or an insulator layer on a semiconductor substrate using semiconductor processing techniques into a size equal to or smaller than those of conventional semiconductor magnetic sensors.

By providing the Hall electrodes so that they extend from the upper surface of the insulator layer onto the surface of the inner wall of the recess, the electron trapping rate is improved to allow more accurate measurement of magnetic fields.

Moreover, the use of a cap of a non-magnetic material prevents magnetic flux from being disturbed, which allows further accurate measurement.

BRIEF DESCRIPTION OF THE DRAWINGS

The invention will be described in detail with reference to the accompanying drawings, wherein.

DETAILED DESCRIPTION OF THE PREFERRED EMBODIMENTS

Figure 1:
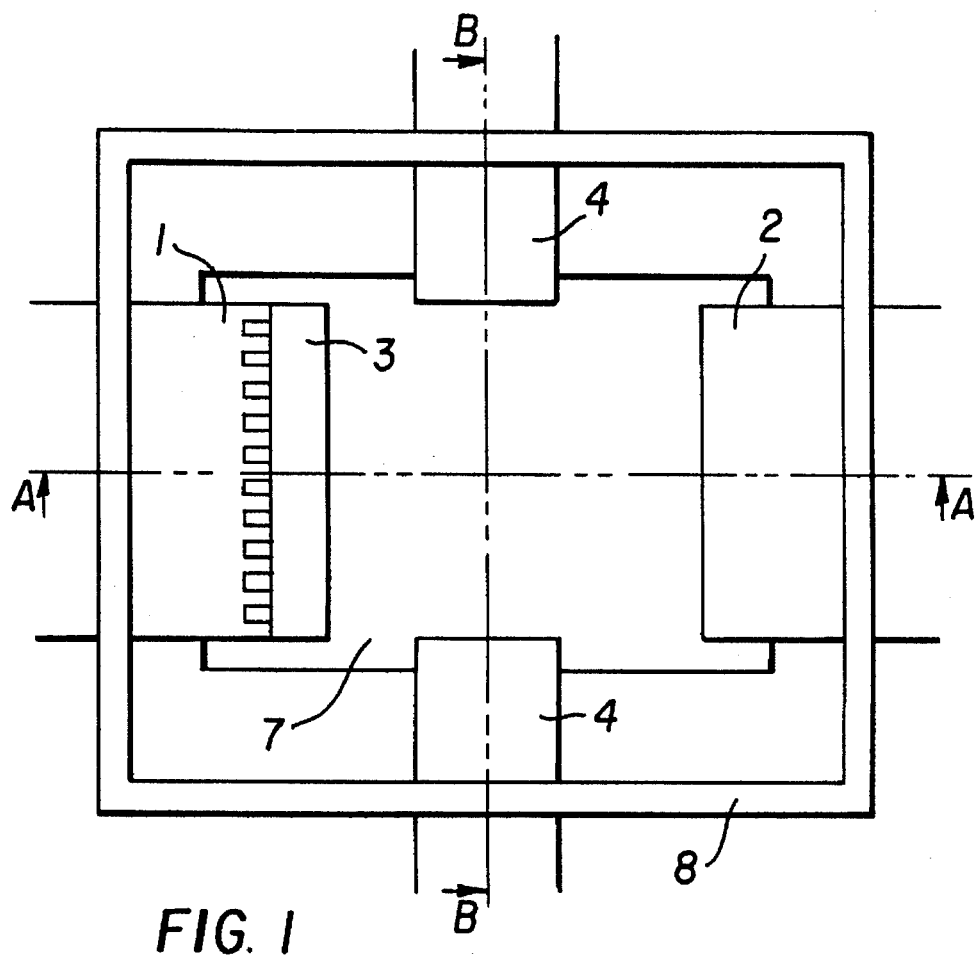
FIG. 1 is a plan view of an embodiment of the magnetic sensor according to the present invention.

An embodiment of the present invention will now be described with reference to the drawings. FIG. 1 is a plan view of a magnetic sensor embodying the present invention wherein the magnetic field to be detected is applied perpendicularly to the surface of the page containing FIG. 1. A rectangular recess 7 is formed in a surface layer of a quartz plate 5, illustrated in the sectional view shown in FIG. 2, and a negative electrode 1 and a positive electrode 2 are provided on the surface of the quartz plate 5 so that their ends project over the recess 7 from two sides of the rectangle which are opposite to each other. Hall electrodes 4 are provided on the surface of the quartz plate 5 on the remaining two sides of the rectangle. Further, a gate electrode 3 is provided on the bottom of the recess 7 so that it faces the negative electrode 1. The width of the negative electrode 1 and the positive electrode 2 is 1100 μm, and the distance between them is 100 μm. The reference numeral 8 designates a cap for providing a vacuum enclosure. In order to prevent the magnetic flux to be measured from disturbances, the cap 8 is made of glass or non-magnetic metal.

Figure 2:
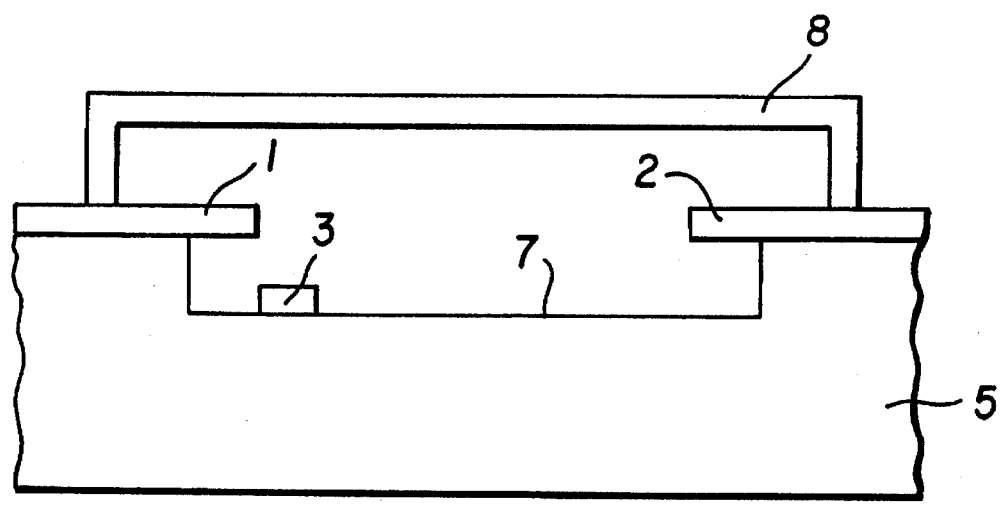
FIG. 2 is a sectional view of the magnetic sensor taken along the line A—A in FIG. 1.

The magnetic field to be detected is applied in the downward direction of FIG. 2. It can be seen that the recess 7 is formed in the surface layer of the quartz plate 5 to a depth of 1 μm, and the end portion of the negative electrode 1 with tips in the form of comb teeth and the end portion of the positive electrode 2 project over the recess 7 like eaves. The gate electrode 3 is formed on the bottom of the recess 7 in the vicinity of the end portion of the negative electrode 1 to apply an electrical field that causes the negative electrode 1 to emit electrons. The space defined by the recess 7 and the cap 8 is evacuated to form a vacuum seal by using a port which is not shown.

Figure 3:
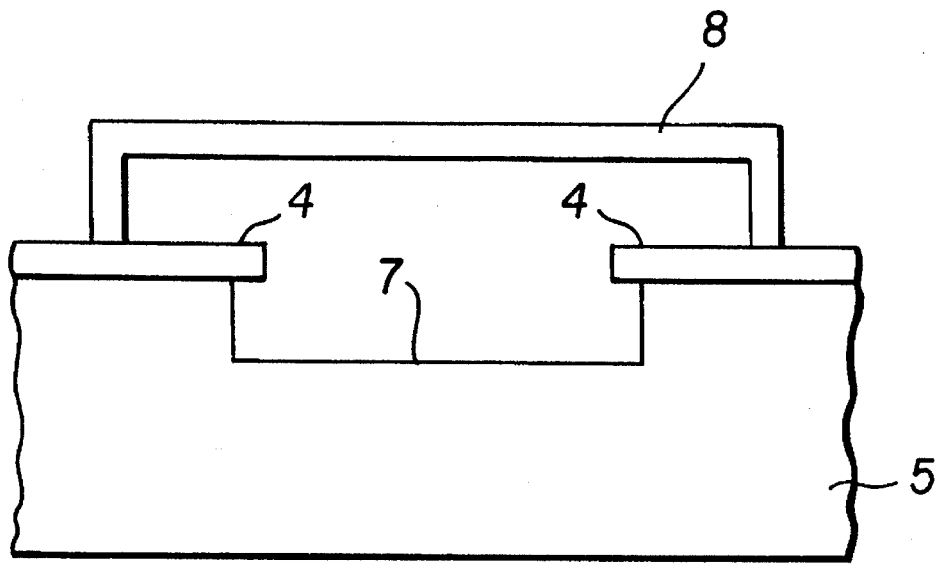
FIG. 3 is a sectional view of the magnetic sensor taken along the line B—B in FIG. 1.

FIG. 3 is a sectional view taken along the line B—B orthogonal to the line A—A in FIG. 1. As apparent from FIG. 1, the Hall electrodes 4 for detecting the Hall voltage can appear on this section which is orthogonal to the section shown in FIG. 2.

Figure 4:
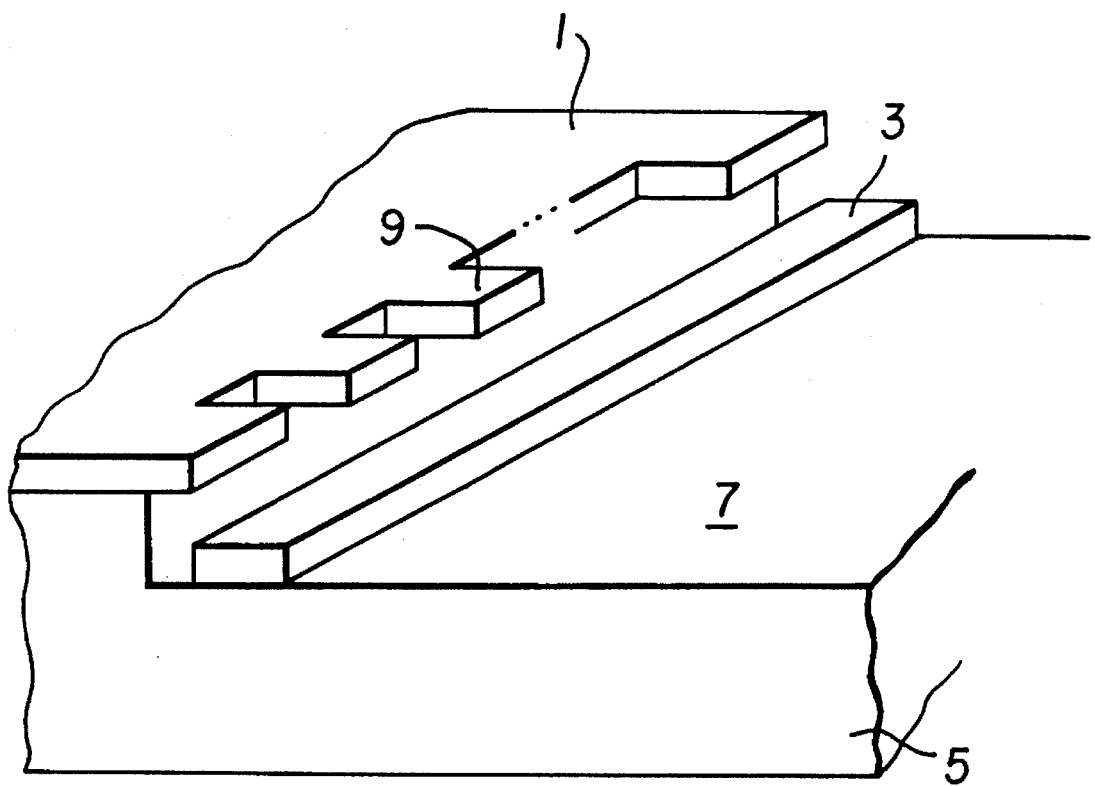
FIG. 4 is an enlarged perspective view of a negative electrode of the magnetic sensor shown in FIG. 1.

FIG. 4 is an enlarged perspective view of the structure of the end portion of the negative electrode according to the present invention. The end portion of the negative electrode 1 is in the form of a comb formed by 270 pieces of tips 9. A tip 9 is 2 μm in width and 6 in length. The tips 9 are arranged with a pitch of 4 μm. The electrical field due to the voltage applied between the gate electrode 3 and the negative electrode 1 causes electrons to be emitted from the end of each edge 9 into the vacuum. The negative electrode 1 and the gate electrode 3 consist of 0.2 μm-thick thin films of tungsten and niobium, respectively.

Figure 5:
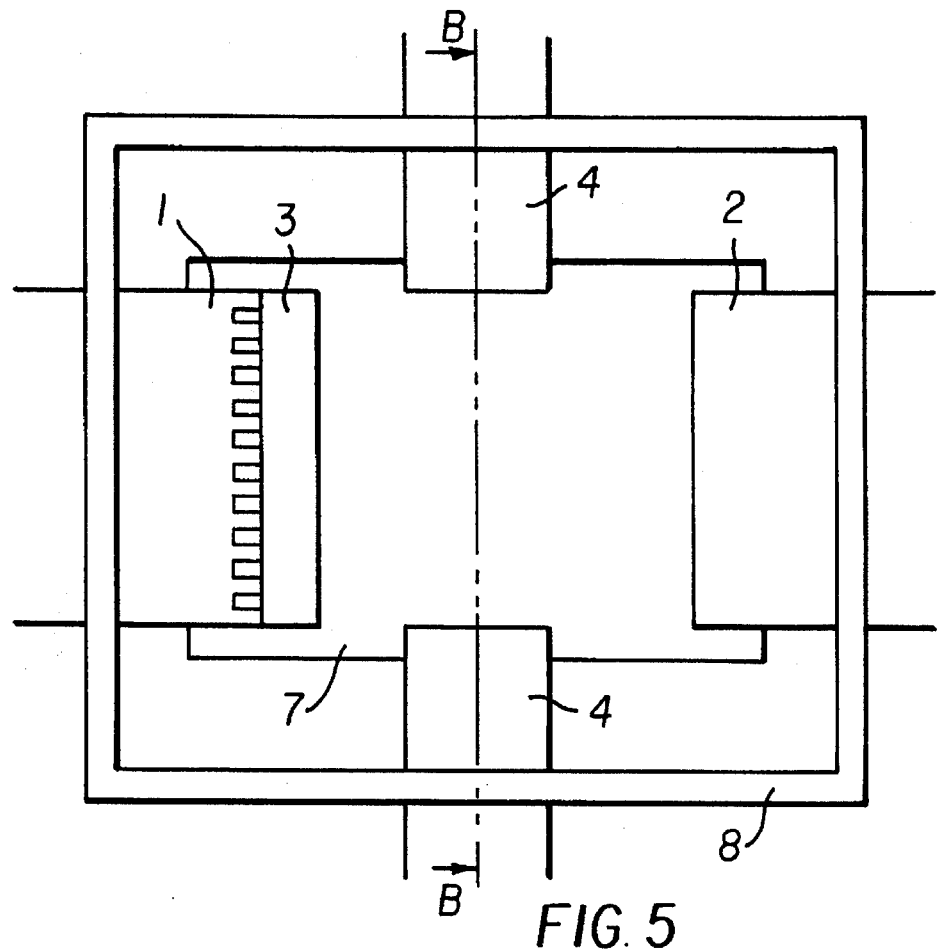
FIG. 5 is a plan view of another embodiment of a magnetic sensor according to the present invention.

FIG. 5 is a plan view of a magnetic sensor as another embodiment of the present invention wherein the magnetic field to be detected is applied perpendicularly to the surface of the page containing the FIG. A silicon substrate having an oxide film formed thereon is used as the insulated substrate instead of the quartz plate. A rectangular recess 7 having a depth of 1 μm is formed like that in the embodiment in FIG. 1 in a 2 μm thick oxide film 10 on a silicon substrate 6, and a negative electrode 1 and a positive electrode 2 are formed on the surface of the oxide film 10 so that their ends project over the recess 7 from two sides of the rectangle which are opposite to each other. On the remaining two sides of the rectangle, Hall electrodes 4 are provided so that they extend from the surface of the oxide film 10 along the inner wall of the recess 7. Like the embodiment shown in FIG. 1, a gate electrode 3 is provided on the bottom of the recess 7 so that it faces the negative electrode 1. In this embodiment, quartz plates, which are expensive especially for those having large diameters, are not used and the applied silicon substrate can be used without any problem since it is more readily processed than a quartz plate by applying techniques for processing semiconductor devices.

Figure 6:
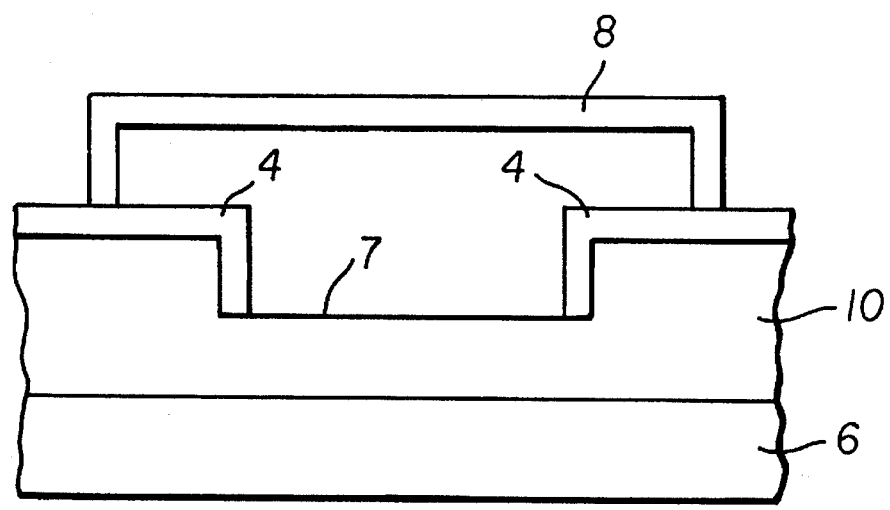
FIG. 6 is a sectional view of the magnetic sensor taken along the line B—B in FIG. 5.
Figure 7:
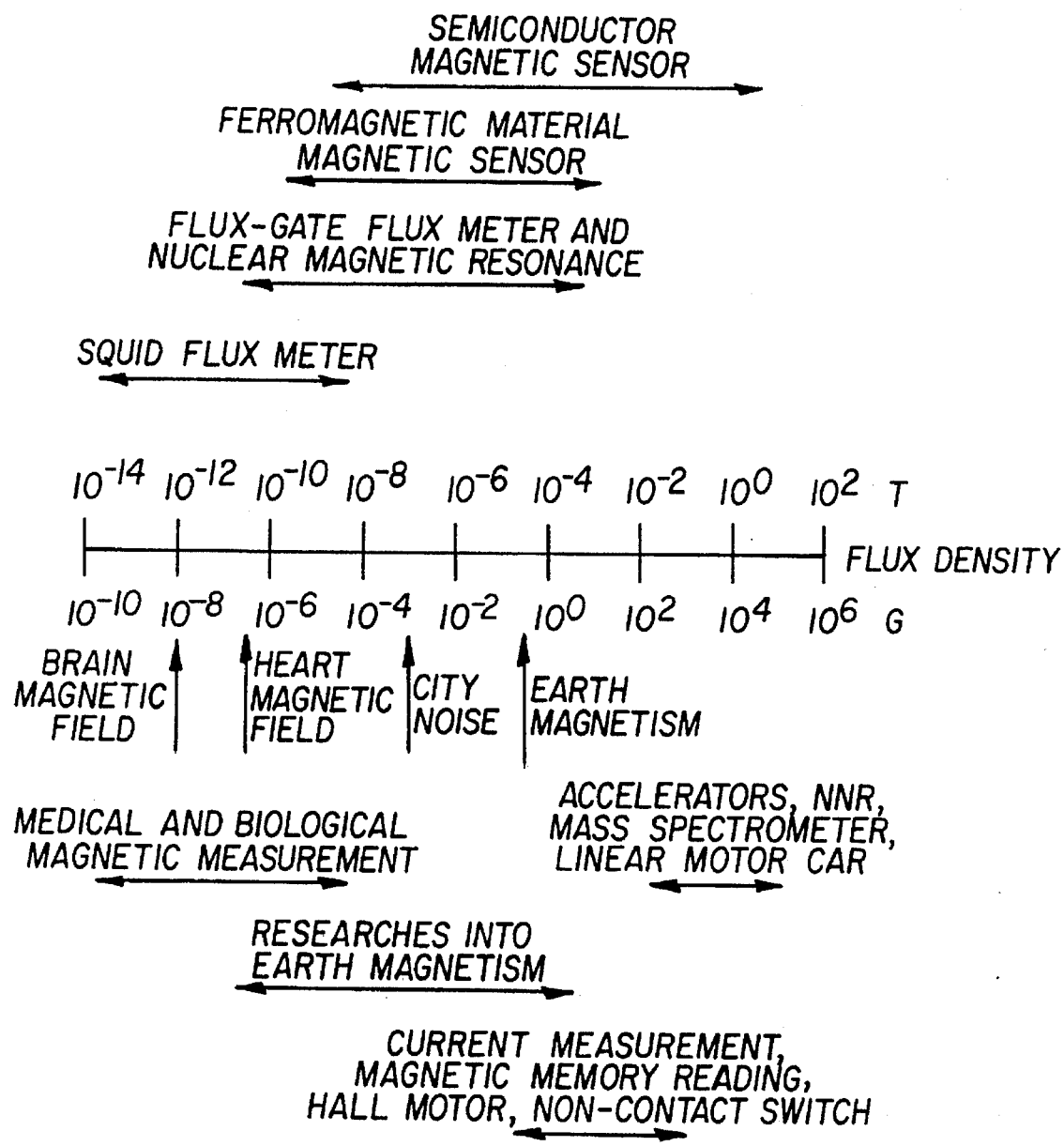
FIG. 7 shows the operational range and field of application of conventional magnetic sensors.

FIG. 6 is a sectional view taken along the line B—B in FIG. 5 which clearly shows how the Hall electrodes 4 for detecting the Hall voltage are extended from the surface of the oxide film 10 along the inner wall of the 7. The area of the electrodes is thus increased to improve electron trapping rate, thereby allowing more accurate measurement.

The magnetic sensor according to the present invention has a structure similar to that of the so-called field emission type micro-vacuum-tubes which are recently attracting attention. It is therefore possible to manufacture it with a similar method to manufacturing a micro-vacuum-tubes such as that described by Kanamaru et al. in page 62 of "Semiconductor World", March, 1992. The detection of magnetism with the magnetic sensors shown in figures are performed as follows. A voltage of approximately 50 V is applied between the negative electrode i and the gate electrode 3 to permit the negative electrode 1 to emit electrons. While the emitted electrons are moved to reach the positive electrode 2 by an electric field due to the voltage applied to the positive electrode 2, they are deflected by a force due to an existing magnetic field. Thus, a Hall voltage is produced between the two Hall electrodes 4.

Table 1 shows the properties of a magnetic sensor having the above described structure according to the present invention in comparison with those of a conventional silicon Hall element magnetic sensor.

TABLE 1

| | Unit | Magnetic Sensor Comprising Typical Silicon Hall Element (Supply Current: 0.3 mA) | Micro-Vacuum-Tube Sensor in the Present Invention Gate Voltage: 50 V Anode Voltage: 200 V Anode current: 150 μA |
|---|---|---|---|
| Product Sensitivity | V/AT | 370 | 4200 (detectable down to $10^{-12}$ T) |
| Error in Linearity | % | <0.2(B< 0.4 T) | <0.01 (B < 1 T) |
| Noise Voltage | μV/√Hz | 0.4 (at 40 Hz) | 0.01 (at 40 Hz) |
| Dimensions of Sensing Section | μm³ | 120 × 120 × 12 | 1000 × 100 × 1 |
| Offset Voltage | mV | <10 | <0.01 |
| Temperature Dependence of Offset Voltage | μV/°C. | 50 | <0.01 (t < 400° C.) |

As shown in the table, the product sensitivity as a sensitivity for magnetic sensing is improved by a factor of ten or more, which results in expansion of the range of measurement. With respect to another items, it will be evident that the invented magnetic sensor is superior to that of silicon Hall element as having an error in linearity improved by a factor of five and other properties by a factor of ten or more except for the dimensions of the sensing section which are approximately the same.

Further, the silicon Hall element magnetic sensor cannot be used at a temperature above 100° C. due to a rapid increase in carrier density caused by intrinsic conduction. On the other hand, the magnetic sensor according to the present invention can be used at temperatures up to 400° C. and is less susceptible to radiations.

With respect to geometry, it can be made equal to or even smaller than conventional magnetic sensors utilizing a semiconductor Hall element.

The insulated substrate is not limited to the quartz plate and the silicon substrate having an oxide film formed thereon as described above, but may be modified to consist of, for example, ceramics such as silicon nitride, or a silicon nitride film formed on a polyimide or silicon substrate.

The tip of the negative electrode may be formed into other shapes such as the shape of a wedge than the comb-like shape as described above as long as it allows the electrical field intensity to increase.

In addition, although only the sensing section on the insulated substrate is sealed in a vacuum by the cap in the above-described embodiment, it is apparent that the entire insulated substrate, i.e., the entire chip, may be enclosed in a vacuum container.

As explained with the embodiments, the present invention provides a magnetic sensor which has higher sensitivity and a wider measuring range compared with conventional Hall element magnetic sensors. In addition, the electrons flow in a vacuum according to the present invention, unlike those flow in a solid, provides an advantage of being not affected by radiation or elevated temperature, which enables the sensor to be used under expanded application conditions.

What is claimed is:

1. A magnetic sensor comprising:

an insulated substrate including a rectangular recess;

a positive electrode located on an upper surface of the insulated substrate that surrounds the rectangular recess, wherein an end of the positive electrode projects over the rectangular recess from a first side of said rectangular recess;

a negative electrode located on the upper surface of the insulated substrate, wherein an end of the negative electrode projects over the rectangular recess from a second side of the rectangular recess that is opposite to said first side, and wherein the end of the negative electrode includes at least one electron emitting tip;

first and second Hall electrodes respectively located on the upper surface of the insulated substrate at third and fourth sides of the rectangular recess;

a gate electrode provided on a bottom surface of the rectangular recess and facing the negative electrode; and containment means for containing the negative electrode, positive electrode, first and second Hall electrodes, and gate electrode in a vacuum.

2. The magnetic sensor according to claim 1, wherein the first and second Hall electrodes respectively project over the third and fourth sides of the rectangular recess.

3. The magnetic sensor according to claim 1, wherein the first and second Hall electrodes are further located along an inner wall of the rectangular recess.

4. The magnetic sensor according to claim 1, wherein the insulated substrate comprises an insulator layer formed on a semiconductor substrate.

5. The magnetic sensor according to claim 2, wherein the insulated substrate comprises an insulator layer formed on a semiconductor substrate.

6. The magnetic sensor according to claim 3, wherein the insulated substrate comprises an insulator layer formed on a semiconductor substrate.

7. The magnetic sensor according to claim 1, wherein the insulated substrate comprises a quartz plate.

8. The magnetic sensor according to claim 2, wherein the insulated substrate comprises a quartz plate.

9. The magnetic sensor according to claim 3, wherein the insulated substrate comprises a quartz plate.

10. The magnetic sensor according to claim 1, wherein the containment means comprises a cap made of a non-magnetic material.

11. The magnetic sensor according to claim 2, wherein the containment means comprises a cap made of a non-magnetic material.

12. The magnetic sensor according to claim 3, wherein the containment means comprises a cap made of a non-magnetic material.

13. The magnetic sensor according to claim 1, wherein the end of the negative electrode includes a plurality of tips in the form of comb teeth.

14. The magnetic sensor according to claim 2, wherein the end of the negative electrode includes a plurality of tips formed as comb teeth.

15. The magnetic sensor according to claim 3, wherein the end of the negative electrode includes a plurality of tips formed as comb teeth.

16. The magnetic sensor according to claim 1, wherein the tip included in the end of the negative electrode is formed as a wedge.

17. The magnetic sensor according to claim 2, wherein the tip included in the end of the negative electrode is formed as a wedge.

18. The magnetic sensor according to claim 3, wherein the tip included in the end of the negative electrode is formed as a wedge.

* * * * *